Feb. 24, 1953 H. A. TOOKER 2,629,785
FREQUENCY SELECTIVE AMPLIFIER
Filed March 30, 1951
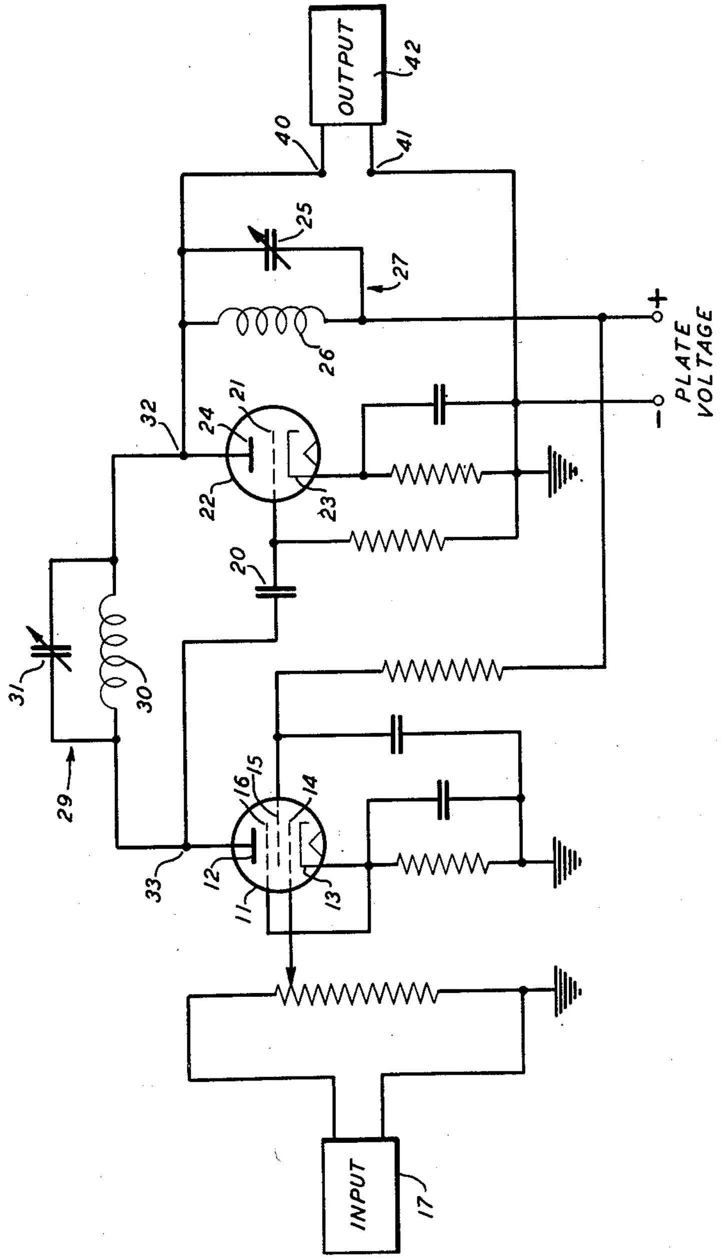
INVENTOR
H. A. TOOKER
BY W. C. Parnell
ATTORNEY Patented Feb. 24, 1953 2,629,785

UNITED STATES PATENT OFFICE 2,629,785

FREQUENCY SELECTIVE AMPLIFIER

Howard A. Tooker, Allentown, Pa., assignor to Western Electric Company, Incorporated, New York, N. Y., a corporation of New York Application March 30, 1951, Serial No. 218,466

6 Claims. (Cl. 179—171)

This invention relates to electronic amplifiers and more particularly to amplifiers of the frequency selective type.

In using amplifiers in connection with testing or measuring operations, such as for example the detection of unbalance in A. C. bridge circuits, it often happens that the apparatus is not isolated from harmonics deriving from power lines and other extraneous sources. Since bridge residual voltages are small at conditions approaching balance, such pickup of harmonics gives rise to measuring errors unless the detecting apparatus used is tuned to the frequency of the source feeding the bridge. While selective amplifiers of this type have been developed in the past, difficulty has been encountered in obtaining satisfactory gain in conjunction with frequency selectivity.

It is therefore an object of this invention to provide an amplifying circuit which furnishes frequency selectivity without loss of overall gain.

Applicant accomplishes his object through the use of a two stage amplifier in which the plate load of the second stage is a parallel resonant circuit. A selective degenerative feedback path is provided from the plate of the second stage back to the first stage which comprises a second parallel resonant circuit tuned to the same frequency. The coil of the second tuned circuit also acts as a shunt feed for the plate voltage on the first stage, thereby eliminating the need for a plate load resistor. This allows a high D. C. plate voltage in the first stage, and results in a high gain at the amplifying frequency, while providing the desired frequency selectivity.

Other objects and advantages will be apparent from the following detailed description taken in conjunction with the attached drawing in which:

The figure is a schematic wiring diagram of the invention.

With reference to the drawing, tube 11 represents the first stage of an amplifier circuit. The tube is a self-biased pentode, comprising a plate 12, cathode 13 and grids 14, 15, and 16, and is conventional in its operation except for its plate circuit, as later described. The tube receives its input signal on the grid 14 from a source 17, which may be a bridge circuit or other signal producing apparatus with which the amplifier is to be used.

The output signal of the tube 11 is correspondingly impressed through a blocking condenser 20 upon the grid 21 of a tube 22, representing the second stage of the amplifier circuit. The tube 22, shown here as a triode, includes a conventional cathode 23 and plate 24. The plate circuit of the tube includes a tuned parallel circuit 27 comprising a variable condenser 25 and a coil 26. This latter circuit is tuned to the desired frequency of the incoming signal.

A second tuned parallel circuit 29, comprising a coil 30 and variable condenser 31 is tuned to the same frequency as the first, and is used to provide degenerative feedback to the grid 21 of the second stage. This second circuit is connected between the point 32 in the plate circuit of the second stage and point 33 in the plate circuit of the first stage. In addition to supplying feedback to the grid 21, the coil 30 of the second tuned circuit acts as the plate load for the first stage, since the positive side of the D. C. plate voltage is connected to the plate 12 through the coils 26 and 30.

One problem previously encountered in the use of resistors as plate loading has been that the conflicting needs of using a low impedance value resistor to provide a high D. C. plate voltage and of using a high value resistor to provide a stronger input signal to the next stage has usually resulted in a compromise between the two opposing requirements. In the present invention, the coil 30, by acting as a plate load, obviates the need for using a conventional resistor for this purpose. More important, the coil, being an inductance, has the desirable quality of presenting a low impedance for D. C., and a high impedance for A. C. This means that it makes possible both the advantages of a high D. C. plate voltage, and of a high A. C. impedance to increase the magnitude of the A. C. signal impressed upon the next stage. The result is that the desired frequency selection can be obtained without loss of overall gain.

The second tuned parallel circuit 29 will inherently present its maximum external impedance to components of its resonant frequency. As a result these components are relatively blocked, while components of other frequencies are allowed to pass through. However, since the feedback is degenerative, these other components will be sharply reduced by the feedback action, which means that essentially only the resonant frequency will appear at the output terminals 40 and 41. This output signal may then be fed into any suitable receiving apparatus 42, such as a detector.

Applicant's circuit as described is simple in comparison with most conventional selective degenerative feedback networks. He is not only able to achieve the same order of selectivity as in present networks, but, by using a parallel tuned resonant circuit as plate loading in addition to its function as a feedback element, he is able to improve the gain in his circuit over that achieved in existing feedback networks.

The proposed apparatus is also simple in adjustment. For small deviations in supply frequency, only the timing of the feedback circuit need be changed to give the same relative selectivity and gain at resonance. In addition, the stability of the amplifier is very good since it does not depend upon resistance values to determine its resonant frequency.

Although the invention has been described with particular reference to A. C. bridge operation, it is of course not limited to such use, but is applicable to any system which requires a combination of frequency selectivity and high overall gain.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

1. In an amplifier system, the combination with a first tube and a second tube, each comprising at least a plate, a grid, and a cathode, and a capacitance coupling between the plate of the first tube and the grid of the second tube, of a tuned circuit comprising an inductance and a capacitance in parallel connected in the plate circuit of the second tube, a second tuned circuit also comprising an inductance and a capacitance in parallel connected between the plates of the two tubes to provide feedback between the output and input of the second tube, and a source of D. C. plate potential for the first tube whose positive side is connected to the plate of the first tube through the coil of the second tuned circuit.

2. In an amplifier system, the combination with a first tube and a second tube, each comprising at least a plate, a grid, and a cathode, and a capacitance coupling between the plate of the first tube and the grid of the second tube, of a tuned circuit comprising an inductance and a capacitance in parallel for feeding energy from the output of the second tube back to the input of same tube, and a source of D. C. plate potential for the first tube whose positive side is connected to the plate of the first tube through the coil of the tuned circuit.

3. In a frequency selective amplifier, the combination with a first tube and a second tube, each comprising at least a plate, a grid, and a cathode, and a capacitance coupling between the plate of the first tube and the grid of the second tube, of a first circuit comprising an inductance and a capacitance in parallel connected in the plate circuit of the second tube, said first circuit being tuned to a desired frequency, a second circuit also comprising an inductance and a capacitance in parallel connected between the plates of the two tubes to provide feedback between the output and the input of the second tube, said second circuit being tuned to the same frequency as the first circuit, and a source of D. C. plate potential for the first tube whose positive side is connected to the plate of the first tube through the coil of the second tuned circuit.

4. In a frequency selective amplifier, the combination with a first tube and a second tube, each comprising at least a plate, a grid, and a cathode, and a capacitance coupling between the plate of the first tube and the grid of the second tube, of a first circuit comprising an inductance and a capacitance in parallel connected in the plate circuit of the second tube, said first circuit being broadly tuned to a desired frequency, a second circuit also comprising an inductance and a capacitance in parallel connected between the plates of the two tubes to provide negative feedback between the output and the input of the second tube, said second circuit being sharply tuned to the same frequency as the first circuit, and a source of D. C. plate potential for the first tube whose positive side is connected to the plate of the first tube through the coil of the second tuned circuit.

5. In a frequency selective amplifier, the combination with a first tube and a second tube, each comprising at least a plate, a grid, and a cathode, and a capacitance coupling between the plate of the first tube and the grid of the second tube, of a frequency selective feedback network including an inductance and a capacitance in parallel associated with the second tube, said network presenting a low impedance to all but the resonant frequency of the feedback network, and a source of D. C. plate potential for the first tube whose positive side is connected to the plate of the first tube through said inductance.

6. In a frequency selective amplifier, the combination with a first tube and a second tube, each comprising at least a plate, a grid, and a cathode, and a capacitance coupling between the plate of the first tube and the grid of the second tube, of a first circuit comprising an inductance and a capacitance in parallel connected in the plate circuit of the second tube, said first circuit being broadly tuned to a desired frequency, and a second circuit also comprising an inductance and a capacitance, one of which is variable, connected in parallel between the plates of the two tubes to provide negative feedback between the output and the input of the second tube, said second circuit being sharply tuned to the same frequency as the first circuit, and with the coil of the second circuit being connected in the plate circuit of the first tube to act as loading therefor simultaneously with its function as a feedback element.

HOWARD A. TOOKER.

REFERENCES CITED

The following references are of record in the file of this patent:

UNITED STATES PATENTS

| Number | Name | Date |
|---|---|---|
| 2,018,370 | Lunnon | Oct. 22, 1935 |